(12) United States Patent
Uetake et al.

(10) Patent No.: US 6,534,981 B2
(45) Date of Patent: Mar. 18, 2003

(54) MR IMAGING METHOD AND MRI APPARATUS

(75) Inventors: Nozomu Uetake, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 22 days.

(21) Appl. No.: 09/829,611

(22) Filed: Apr. 11, 2001

(65) Prior Publication Data

US 2001/0043067 A1 Nov. 22, 2001

(30) Foreign Application Priority Data

May 17, 2000 (JP) ........................... 2000-144329

(51) Int. Cl.$^7$ ................................. G01V 3/00
(52) U.S. Cl. ............................ 324/307; 324/309
(58) Field of Search .................... 324/307, 309

(56) References Cited

U.S. PATENT DOCUMENTS

| 4,740,749 | A |   | 4/1988  | Yamamoto et al. |         |
|-----------|---|---|---------|-----------------|---------|
| 4,780,675 | A | * | 10/1988 | DeMeester et al.| 324/309 |
| 4,833,407 | A | * | 5/1989  | Holland et al.  | 324/309 |
| 4,884,029 | A | * | 11/1989 | Sattin          | 324/309 |
| 4,912,413 | A | * | 3/1990  | DeMeester et al.| 324/309 |
| 4,959,611 | A | * | 9/1990  | Brovost et al.  | 324/307 |
| 5,073,752 | A | * | 12/1991 | DeMeester et al.| 324/309 |
| 5,239,266 | A | * | 8/1993  | Kaufman et al.  | 324/309 |
| 5,621,321 | A | * | 4/1997  | Liu et al.      | 324/307 |
| 5,680,045 | A | * | 10/1997 | Feinberg        | 324/307 |
| 5,825,185 | A | * | 10/1998 | Liu et al.      | 324/307 |
| 5,899,858 | A | * | 5/1999  | Muthupillai et al.| 324/307 |
| 6,043,650 | A | * | 3/2000  | Taniguchi et al.| 324/306 |
| 6,111,411 | A | * | 8/2000  | Saranathan et al.| 324/313 |
| 6,154,029 | A | * | 11/2000 | Miyamoto et al. | 324/312 |
| 6,240,310 | B1| * | 5/2001  | Bundy et al.    | 324/307 |
| 6,388,442 | B1| * | 5/2002  | Uetake et al.   | 324/309 |
| 6,407,549 | B1| * | 6/2002  | Uetake et al.   | 324/307 |
| 6,476,607 | B1| * | 11/2002 | Dannels et al.  | 324/309 |

FOREIGN PATENT DOCUMENTS

JP              62046243        2/1987

* cited by examiner

Primary Examiner—Edward Lefkowitz
Assistant Examiner—Dixomara Vargas
(74) Attorney, Agent, or Firm—Moonray Kojima

(57) ABSTRACT

With an intention to improve picture quality without increasing the overall number of times of data collection and to restrain artifacts resulting from differences in noise structure between parts differing in the number of times of addition, the total number V of views is equally divided into eight, and the areas of the two ends of each V/8, where the absolute value of the quantity of phase encoding is the greatest, are reduced in the number of times of addition by ½ of the reference number of times N, because their contributions to picture quality is small. The remaining middle 6V/8 areas are increased in the number of times of addition by ½ of the reference number of times N, because their contributions to picture quality are great, and further to alleviate the non-continuity of the variations of the number of times of addition, the number of times of addition in the middle 6V/8 areas is varied so as to follow either a Hamming function or a Hanning function.

8 Claims, 6 Drawing Sheets

MR IMAGING METHOD AND MRI APPARATUS

BACKGROUND OF THE INVENTION

The present invention relates to an MR imaging method and an MRI (Magnetic Resonance Imaging) apparatus, and more particularly to an MR imaging method and an MRI apparatus capable of improving picture quality without increasing the number of times of data collection and restraining artifacts resulting from differences in noise structure between parts differing in the number of times of addition.

In an MR imaging method, it is usual to configure k spaces out of views from the first view through a Vth view which differ in the quantity of phase encoding, repeatedly collect data by Xn times of addition in an nth (n=1~V) view, and use data An resulting from arithmetic averaging as the data of the nth view for image reconfiguration.

According to the related art, the number of times of addition Xn may be constant all the time as illustrated in FIG. 1, varied linearly to become greater as the absolute value of the quantity of phase encoding decreases as illustrated in FIG. 2, or varied stepwise to become greater as the absolute value of the quantity of phase encoding decreases as illustrated in FIG. 3.

By an MR imaging method according to the related art, whereby the number of times of addition Xn is to be kept constant all the time as shown in FIG. 1, there is a problem that picture quality is little improved relative to an increase in the overall number of times of data collection because parts where the absolute value of the quantity of phase encoding is large, which little contribute to picture quality, and parts where the absolute value of the quantity of phase encoding is small, which greatly contribute to picture quality, are added the same number of times.

On the other hand, where the number of times of addition is varied to become greater as the absolute value of the quantity of phase encoding decreases as shown in FIG. 2 or FIG. 3, picture quality can be improved without increasing the overall number of times of data collection because parts where the absolute value of the quantity of phase encoding is large, which little contribute to picture quality, are added a fewer number of times and because parts where the absolute value of the quantity of phase encoding is small, which greatly contribute to picture quality, are added a greater number of times.

However, where the variation is linear as shown in FIG. 2, there is a problem that the advantage of improving picture quality without increasing the overall number of times of data collection is not sufficient because, although the number of times of addition is maximized in the view where the absolute value of the quantity of phase encoding is "0", the number of times of addition linearly decreases in a part away from that view even by a minimal distance.

On the other hand, where the variation is stepwise as shown in FIG. 3, the advantage of improving picture quality without increasing the overall number of times of data collection is increased because the number of times of addition is maximized not only in the view where the absolute value of the quantity of phase encoding is "0" but also in neighboring views.

However, since the variation in the number of times of addition is not continuous, there is a problem that differences in noise structure between parts differing in the number of times of addition are apt to invite the emergence of artifacts.

SUMMARY OF THE INVENTION

Therefore, an object of the present invention is to provide an MR imaging method and an MRI apparatus capable of improving picture quality without increasing the overall number of times of data collection and restraining artifacts resulting from differences in noise structure between parts differing in the number of times of addition.

In its first aspect, the invention provides an MR imaging method whereby k spaces are configured out of views from the first view, where the quantity of phase encoding takes on the largest negative (or positive) value, through a Vth view, where the quantity of phase encoding takes on the largest positive (or negative) value, and data An resulting from arithmetic averaging as the data of the nth view resulting from repeated collection of data by Xn times of addition in an nth (n=1~V) view are used for image reconfiguration, characterized in that the number of times of addition Xn is varied to become greater as the absolute value of the quantity of phase encoding decreases and to cause all or part of it to follow either a Hamming function or a Hanning function.

The above-described MR imaging method according to the first aspect can improve picture quality without increasing the overall number of times of data collection because the number of times of addition Xn is varied to become greater as the absolute value of the quantity of phase encoding decreases and to cause all or part of it to follow either a Hamming function or a Hanning function, and accordingly the number of times of addition is increased not only in the view where the absolute value of the quantity of phase encoding is "0" but also in neighboring views. Moreover, since the variation in the number of times of addition is continuous, artifacts resulting from differences in noise structure between parts differing in the number of times of addition can be restrained.

In its second aspect, the invention provides an MR imaging method whereby k spaces are configured out of views from the first view, where the quantity of phase encoding takes on the largest negative (or positive) value, through a Vth view, where the quantity of phase encoding takes on the largest positive (or negative) value, and data An resulting from arithmetic averaging as the data of the nth view resulting from repeated collection of data by Xn times of addition in an nth (n=1~V) view are used for image reconfiguration, characterized in that, where the reference number of times of addition is N:

(1) the number of times of addition from the first view till the (V/8)-th view is (N−N/2);

(2) the number of times of addition from the (V−V/8+1)-th view till the Vth view is (N−N/2);

(3) the number of times of addition from the (V/8+1)-th view till the (V−V/8)-th view is (N+N/2); and (4) the number of times of addition from the (V/8+1)-th view till the (V−V/8)-th is a value resulting from the subtraction of (N−N/2) from the earlier calculated number of times of addition, multiplication of the balance by either a Hamming function or a Hanning function, addition of (N−N/2) to the product, and discrete processing of the sum.

By the above-described MR imaging method according to the second aspect, the total number of views V is equally divided into eight, and the areas of the two ends of each V/8, where the absolute value of the quantity of phase encoding is the greatest, are reduced in the number of times of addition by ½ of the reference number of times N, because their contributions to picture quality is small. On the other hand, the remaining middle 6V/8 areas are increased in the number of times of addition by ½ of the reference number of times N, because their contributions to picture quality are great, and further to alleviate the non-continuity of the variations of the number of times of addition, the number of times of addition is varied so as to follow either a Hamming function or a Hanning function. This makes possible improvement of picture quality without increasing the overall number of times of data collection because the number of times of addition is increased not only in the view where the absolute value of the quantity of phase encoding is "0" but also in neighboring views. Furthermore, as the variation in the number of times of addition is continuous in the part from the (V/8+1)-th view till the (V–V/8)-th view, whose contributions to picture quality are great, artifacts resulting from differences in noise structure between parts differing in the number of times of addition can be restrained.

In its third aspect, the invention provides an MR imaging method whereby k spaces are configured out of views from the first view, where the quantity of phase encoding takes on the largest negative (or positive) value, through a Vth view, where the quantity of phase encoding takes on the largest positive (or negative) value, and data An resulting from arithmetic averaging as the data of the nth view resulting from repeated collection of data by Xn times of addition in an nth (n=1~V) view are used for image reconfiguration, characterized in that, where the reference number of times of addition is N:

(1) the number of times of addition from the first view till the (V/8)-th view is (N–N/2);

(2) the number of times of addition from the (V–V/8+1)-th view till the Vth view is (N–N/2);

(3) the number of times of addition from the (V/2–V/8+1)-th view till the (V2+V/8)-th view is (N+N/2);

(4) the number of times of addition from the (V/8+1)-th view till the (V/2–V/8)-th view is a number of times represented by a straight line linking the (V/8)-th view with the (V/2–V/8+1)-th;

(5) the number of times of addition from the (V/2+V/8+1)-th view till the (V–V/8)-th view is a number of times represented by a straight line linking the (V/2+V/8)-th view with the (V–V/8+1)-th; and (6) the number of times of addition from the (V/8+1)-th view till the (V–V/8)-th is a value resulting from the subtraction of (N–N/2) from the earlier calculated number of times of addition, multiplication of the balance by either a Hamming function or a Hanning function, addition of (N–N/2) to the product, and discrete processing of the sum.

By the above-described MR imaging method according to the third aspect, the total-number of views V is equally divided into eight, and the areas of the two ends of each V/8, where the absolute value of the quantity of phase encoding is the greatest, are reduced in the number of times of addition by ½ of the reference number of times N, because their contributions to picture quality is small. On the other hand, the remaining middle 6V/8 areas are increased in the number of times of addition by ½ of the reference number of times N, because their contributions to picture quality are great. Then, the areas in which the number of times of addition has been reduced by ½ of the reference number of times N and the areas in which the number of times of addition has been increased by ½ of the reference number of times N are linked by a straight line to equalize the overall number of times of addition. Further to alleviate the non-continuity of the variations of the number of times of addition, the number of times of addition in the middle 6V/8 areas is varied so as to follow either a Hamming function or a Hanning function. This makes possible improvement of picture quality without increasing the overall number of times of data collection because the number of times of addition is increased not only in the view where the absolute value of the quantity of phase encoding is "0" but also in neighboring views. Furthermore, as the variation in the number of times of addition is continuous in the part from the (V/8+1)-th view till the (V–V/8)-th view, whose contributions to picture quality are great, artifacts resulting from differences in noise structure between parts differing in the number of times of addition can be restrained.

In its fourth aspect, the invention provides an MRI apparatus comprising an RF pulse transmitting means, a slope pulse applying means and an NMR signal receiving means, wherein those means are controlled so as to use for image reconfiguration data An resulting from repeated collection by Xn times of addition and the arithmetic averaging of data in an nth view (n=1~V) of k spaces configured out of views from the first view, where the quantity of phase encoding takes on the largest negative (or positive) value, through a Vth view, where the quantity of phase encoding takes on the largest positive (or negative) value, characterized in that it is further provided with a determination means for the number of times of addition to vary the number of times of addition Xn to become greater as the absolute value of the quantity of phase encoding decreases and to cause all or part of it to follow either a Hamming function or a Hanning function.

The above-described MRI apparatus according to the fourth aspect of the invention can appropriately implement the MR imaging method according to the first aspect described above.

In its fifth aspect, the invention provides an MRI apparatus comprising an RF pulse transmitting means, a slope pulse applying means and an NMR signal receiving means, wherein those means are controlled so as to use for image reconfiguration data An resulting from repeated collection by Xn times of addition and the arithmetic averaging of data in an nth view (n=1~V) of k spaces configured out of views from the first view, where the quantity of phase encoding takes on the largest negative (or positive) value, through a Vth view, where the quantity of phase encoding takes on the largest positive (or negative) value, characterized in that it is further provided with a determination means for the number of times of addition to perform, where the reference number of times of addition is N, addition (N–N/2) times from the first view till the (V/8)-th view; addition (N–N/2) times from the (V–V/8+1)-th view till the Vth view; addition (N+N/2), times from the (V/8+1)-th view till the (V–V/8)-th view; and addition, from the (V/8+1)-th view till the (V–V/8)-th, as many times as a value resulting from the subtraction of (N–N/2) from the earlier calculated number of times of addition, multiplication of the balance by either a Hamming function or a Hanning function, addition of (N–N/2) to the product, and discrete processing of the sum.

The above-described MRI apparatus according to the fifth aspect of the invention can appropriately implement the MR imaging method according to the second aspect described above.

In its sixth aspect, the invention provides an MRI apparatus comprising an RF pulse transmitting means, a slope pulse applying means and an NMR signal receiving means, wherein those means are controlled so as to use for image reconfiguration data An resulting from repeated collection by Xn times of addition and the arithmetic averaging of data in an nth view (n=1~V) of k spaces configured out of views from the first view, where the quantity of phase encoding takes on the largest negative (or positive) value, through a Vth view, where the quantity of phase encoding takes on the largest positive (or negative) value, characterized in that it is further provided with a determination means for the number of times of addition to perform, where the reference number of times of addition is N, addition (N−N/2) times from the first view till the (V/8)-th view; addition (N−N/2) times from the (V−V/8+1)-th view till the Vth view; addition (N+N/2) times from the (V/2−V/8+1)-th view till the (V/2+V/8)-th view; addition, from the (V/8+1)-th view till the (V/2−V/8)-th view, a number of times represented by a straight line linking the (V/8)-th view with the (V/2−V/8+1)-th; addition, from the (V/2+V/8+1)-th view till the (V−V/8)-th view, a number of times represented by a straight line linking the (V/2+V/8)-th view with the (V−V/8+1)-th; and addition, from the (V/8+1)-th view till the (V−V/8)-th, as many times as a value resulting from the subtraction of (N−N/2) from the earlier calculated number of times of addition, multiplication of the balance by either a Hamming function or a Hanning function, addition of (N−N/2) to the product, and discrete processing of the sum.

The above-described MRI apparatus according to the sixth aspect of the invention can appropriately implement the MR imaging method according to the third aspect described above.

By the MR imaging method and the MRI apparatus according to the present invention, picture quality can be efficiently improved without increasing the overall number of times of data collection. Furthermore, artifacts resulting from differences in noise structure between parts differing in the number of times of addition Xn can be restrained.

Further objects and advantages of the present invention will be apparent from the following description of the preferred embodiments of the invention as illustrated in the accompanying drawings.

DETAILED DESCRIPTION OF THE INVENTION

The present invention will be described in further detail below with reference to modes of implementing it illustrated in drawings. These modes do not limit the invention, though.

First Mode of Implementation

Figure 1:
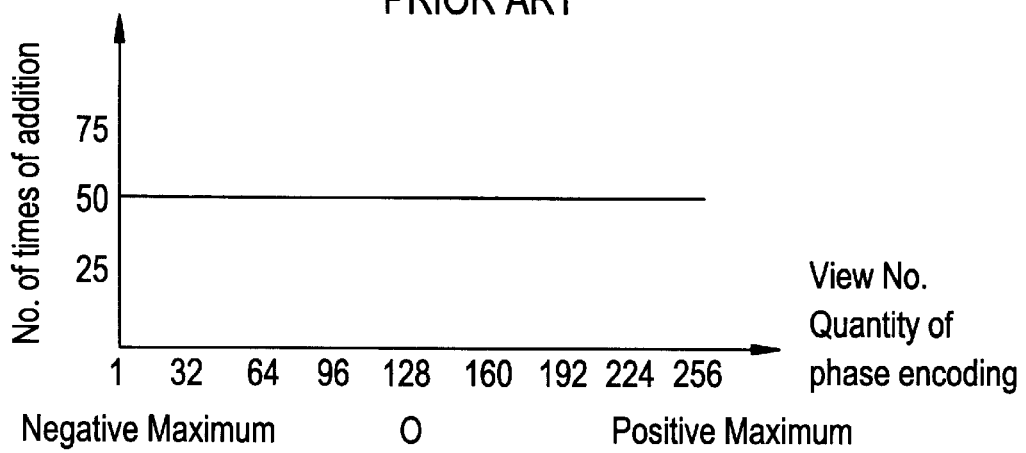
FIG. 1 is an explanatory diagram illustrating the number of times of addition in a first example of the related art.
Figure 2:
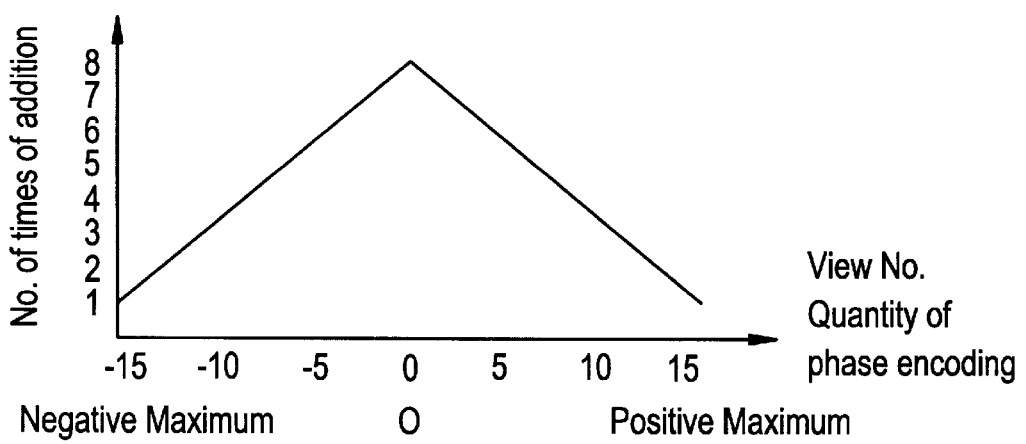
FIG. 2 is an explanatory diagram illustrating the number of times of addition in a second example of the related art.
Figure 3:
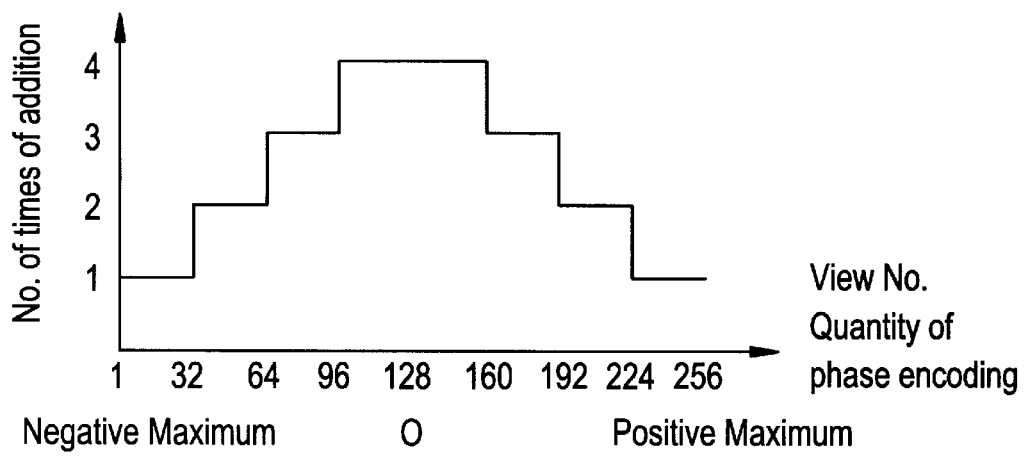
FIG. 3 is an explanatory diagram illustrating the number of times of addition in a third example of the related art.
Figure 4:
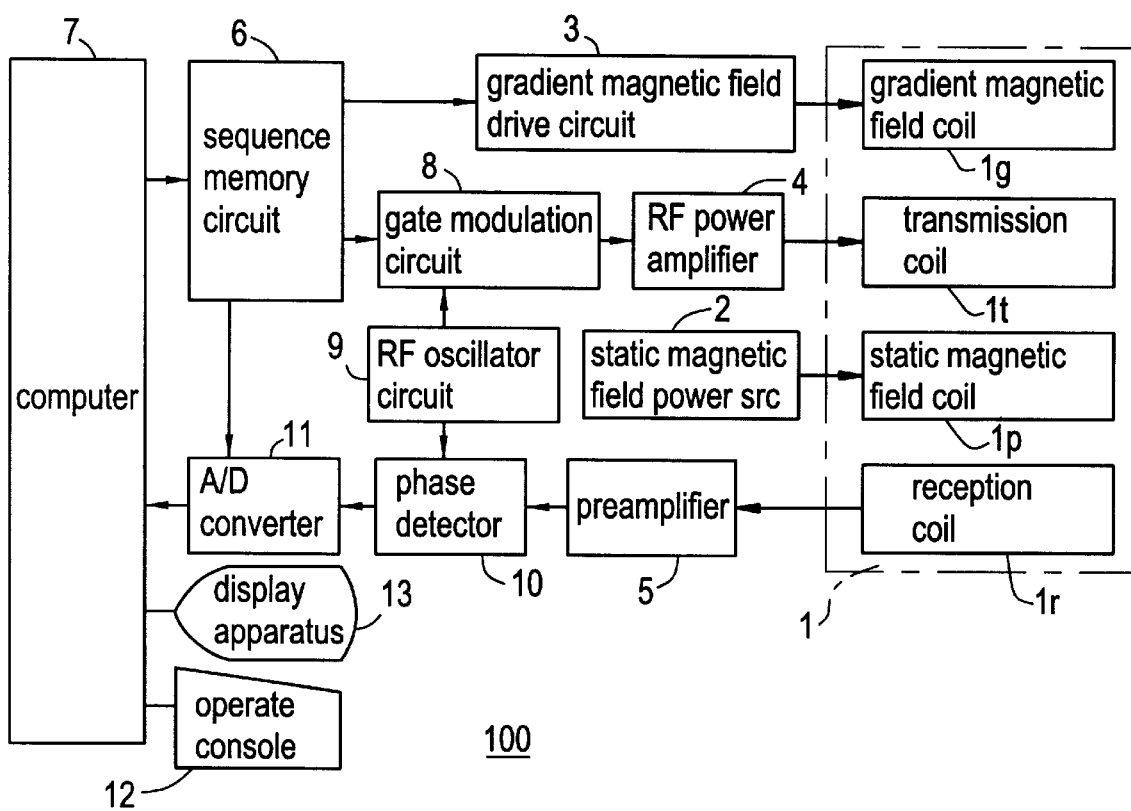
FIG. 4 is a block diagram of an MRI apparatus pertaining to the present invention.

FIG. 4 is a block diagram of an MRI apparatus in the first mode of implementing the invention.

In this MRI apparatus 100, a magnet assembly 1 has within it a void part (hole) into which a sample is to be inserted and, surrounding this void part, there are arranged a static-magnetic field coil 1p; a gradient magnetic field coil 1g for generating the gradient magnetic filed of a slice axis, a lead axis and a phase axis; a transmission coil 1t for providing an RF pulse for exciting atomic nucleus spins within the sample; and a reception coil 1r for detecting an NMR signal from the sample. These static magnetic field coil 1p, gradient magnetic field coil 1g, transmission coil 1t and reception coil 1r are respectively connected to a static magnetic field power source 2, a gradient magnetic field drive circuit 3, an RF power amplifier 4 and a preliminary amplifier 5.

Incidentally, a permanent magnet may be used in place of the static magnetic field coil 1p.

A sequence memory circuit 6, in accordance with an instruction from a computer 7, operates the gradient magnetic field drive circuit 3 on the basis of a pulse sequence stored in it, generates a gradient magnetic field from the gradient magnetic field coil 1g of the aforementioned magnet assembly 1 and, at the same time, operates a gate modulation circuit 8 to modulate the carrier output signal of an RF oscillator circuit 9 into a pulse-shaped signal of a prescribed timing in a prescribed envelope form, applies it as an RF pulse to the RF power amplifier 4 and, after its power amplification by the RF power amplifier 4, applies it to the transmission coil 1t of the aforementioned magnet assembly 1 to selectively excite a desired slice area.

The preliminary amplifier 5 amplifies the NMR signal from the sample, detected by the reception coil 1r of the magnet assembly 1, and inputs it to a phase detector 10. The phase detector 10, with the carrier output signal of the RF oscillator circuit 9 as its reference signal, phase-detects the NMR signal from the preliminary amplifier 5, and provides it to an A/D converter 11. The A/D converter 11 converts the phase-detected analog signal into a digital signal, and inputs it to the computer 7. an operation to reconfigure an image, and generates an image of a desired slice area. Here, the operation for image reconfiguration is carried out by configuring k spaces out of views from the first view, where the quantity of phase encoding takes on the largest negative value, through a Vth view, where the quantity of phase encoding takes on the largest positive value, repeatedly connecting data in an nth (n=1, 2, . . . , V) as many times as a number of times of addition Xn, subjecting them to arithmetic averaging, and using the arithmetically averaged data An as the data of the nth view.

Figure 5:
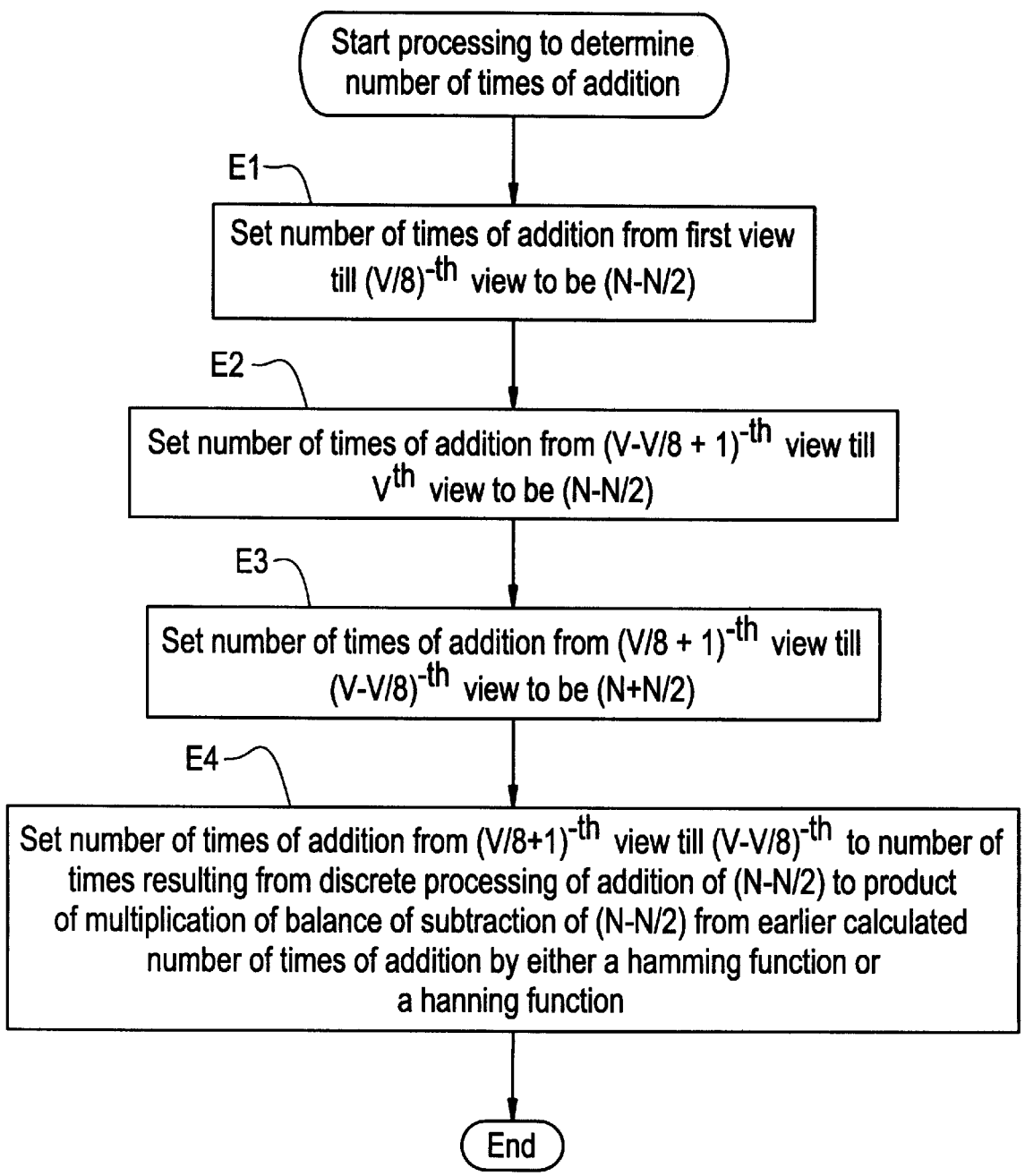
FIG. 5 is a flowchart of to determination of the number of times of addition processing in the first mode of implementing the invention.

The computer 7 further executes processing to determine the number of times of addition shown in FIG. 5 to determine the number of times of addition Xn. It is responsible for over all control, further including reception of information inputted from an operation console 12.

A display apparatus 13 carries out displaying of the aforementioned image among other things.

FIG. 5 is a flowchart of processing to determination of the number of times of addition pertaining to the present invention. Incidentally, for the convenience of description, it is supposed that V=256 and the reference number of times of addition N=50. This reference number of times of addition N can be set by the operator as desired.

Figure 6:
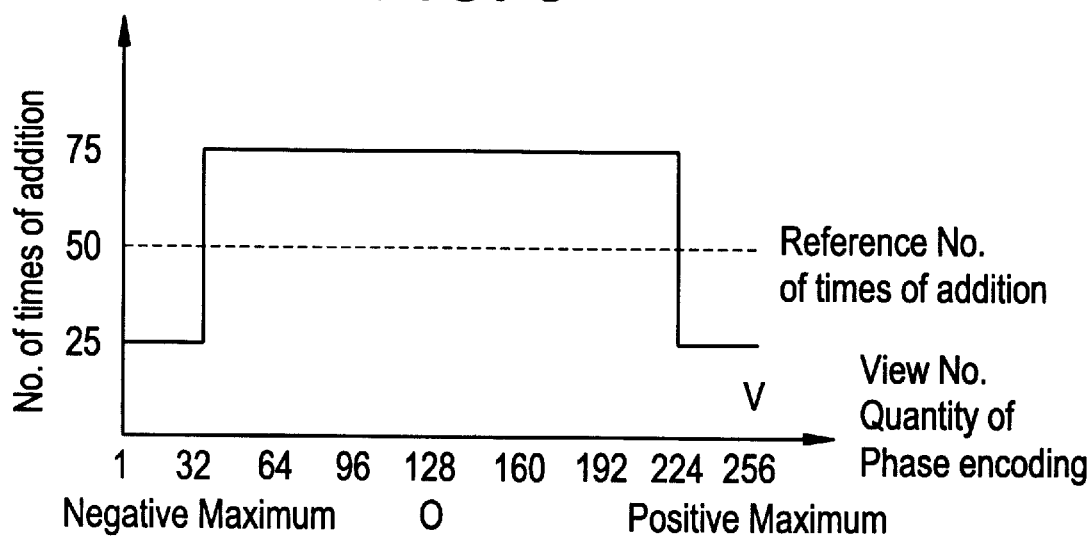
FIG. 6 is an explanatory diagram illustrating calculation of the number of times of addition in progress in the first mode of implementing the invention.

At step E1, as shown in FIG. 6, the number of times of addition Xn from the first view till a 32nd (32=V/8) view is set to be 25(=N−N/2).

At step E2, as shown in FIG. 6, the number of times of addition Xn from a 225th (225=V−V/8+1) view till a 256th (256=V) view is set to be 25(=N−N/2).

At step E3, as shown in FIG. 6, the number of times of addition Xn' from a 33rd (33=V/8+1) till a 224th (224=V−V/8) view is set to be 75 (75=N+N/2).

Figure 7:
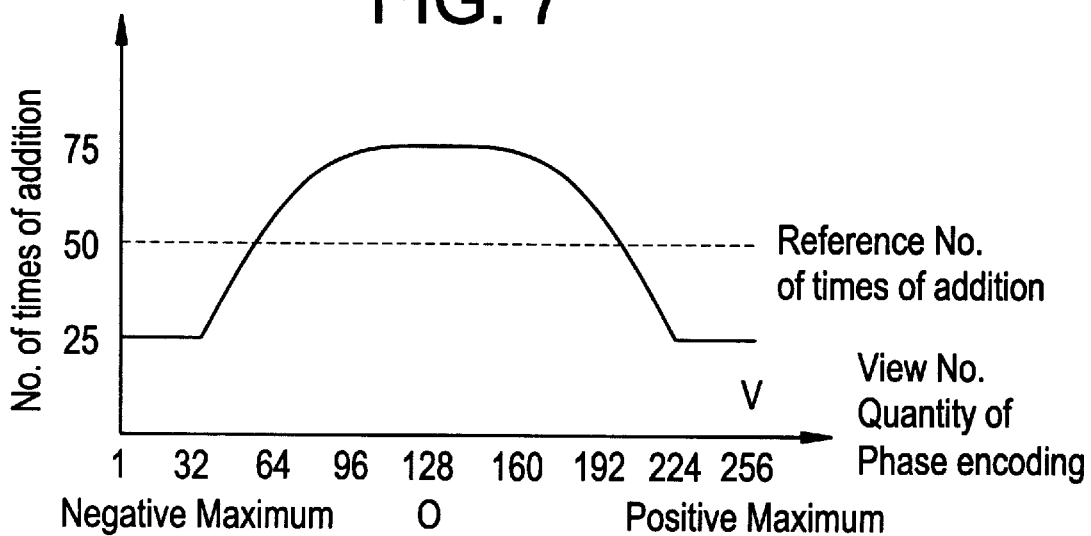
FIG. 7 is an explanatory diagram illustrating the result of calculation of the number of times of addition in the first mode of implementing the invention.

At step E4, as shown in FIG. 7, the balance "50" of the subtraction of "25"(=N−N/2) from the number of times of addition Xn'=75 from the 33rd (33=V/8+1) view till the 224th (224=V−V/8) view is multiplied by the following Hamming function:

$$Wn=0.54-0.46\cdot\cos\{2\pi(n-V/8)/(3V/4)\}$$

Or it is multiplied by the following Hanning function:

$$Wn=0.5(1-\cos\{2\pi(n-V/8)/(3V/4)\}$$

Then, "25" (=N−N/2) is added. Further, the resultant sum is subjected to discrete processing, whose result represents the number of times of addition Xn in the nth view. Thus, where an integral function is denoted by int{ }, the number of times of addition Xn of the nth view is calculated by:

$$Xn=int\{[Xn'(N-N/2)]\cdot Wn+(N-N/2)\}$$

The above-described MRI apparatus 100 reduces the number of times of addition Xn in parts where the absolute value of the quantity of phase encoding is large, which little contribute to picture quality, and increases the number of times of addition Xn in parts where the absolute value of the quantity of phase encoding is small, which greatly contribute to picture quality. The number of times of addition Xn is increased not only in the part where the absolute value of the quantity of phase encoding is "0" but also in its vicinities. Therefore, picture quality can be efficiently improved without increasing the overall number of times of data collection Furthermore, as the variation in the number of times of addition Xn is continuous in the part from the 33rd (33=V/8+1) view till the 224th (224=V−V/8) view, whose contributions to picture quality are great, artifacts resulting from differences in noise structure between parts. differing in the number of times of addition Xn can be restrained.

Second Mode of Implementation

Figure 8:
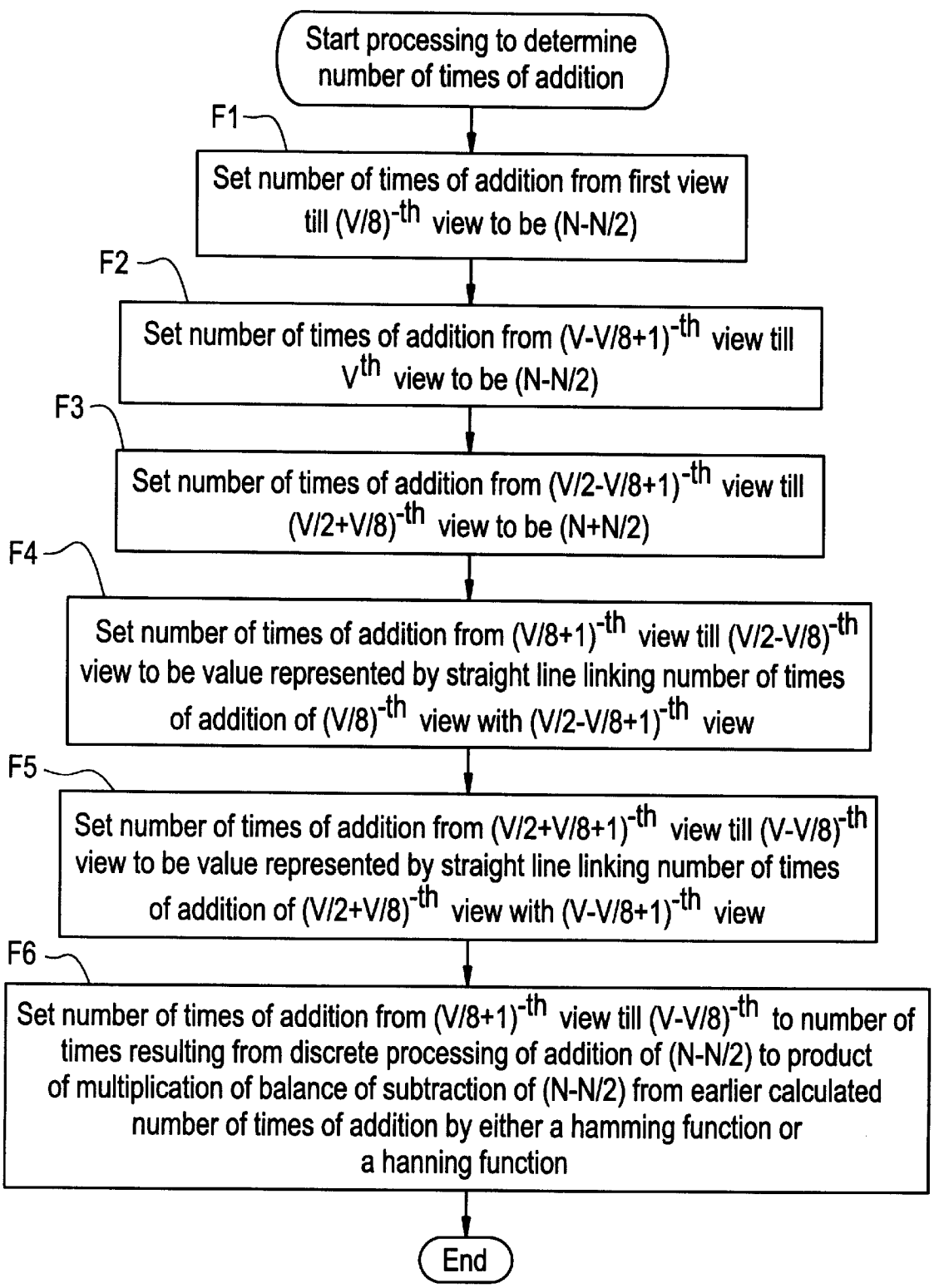
FIG. 8 is a flowchart of processing to determine the number of times of addition pertaining to a second mode of implementing the invention.

FIG. 8 is another flowchart of processing to determine the number of times of addition pertaining to the present invention. Incidentally, for the convenience of description, it is supposed that V=256 and the reference number of times of addition N=50.

Figure 9:
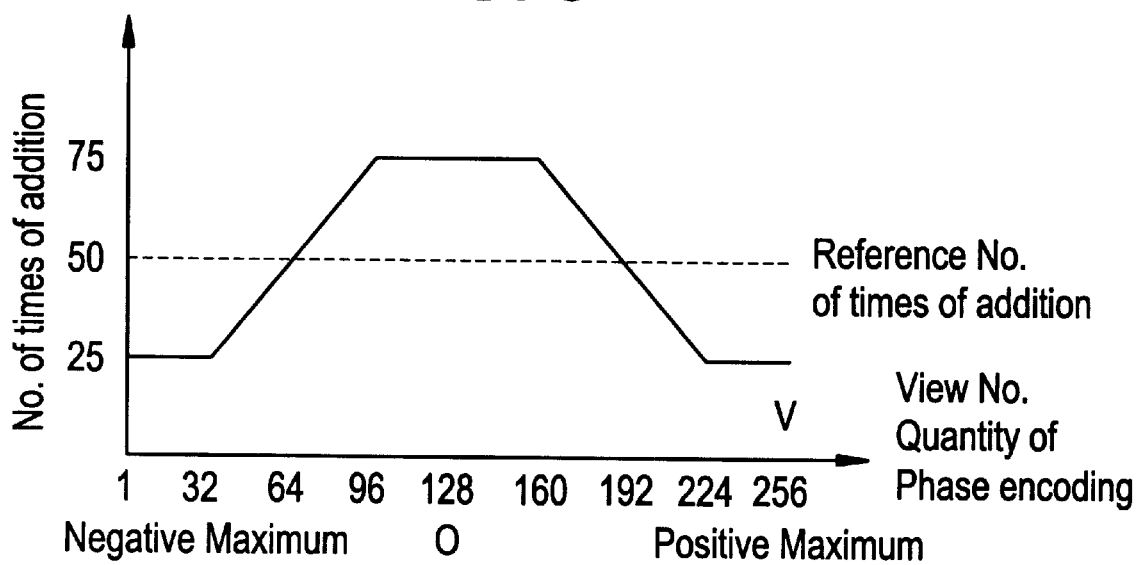
FIG. 9 is an explanatory diagram illustrating calculation of the number of times of addition in progress in the second mode of implementing the invention.

At step F1, as shown in FIG. 9, the number of times of addition Xn from the first view till a 32nd (32=V/8) view is set to be 25(=N−N/2).

At step F2, as shown in FIG. 9, the number of times of addition Xn from a 225th (225=V−V/8+1) view till a 256th (256=V) view is set to be 25 (=N−N/2).

At step F3, as shown in FIG. 9, the number of times of addition Xn' from a 97th (97=V/2−V/8+1) till a 160th (160=V/2+V/8) view is set to be 75 (75=N+N/2)

At step F4, as shown in FIG. 9, the number of times of addition Xn' from a 33rd (33=V/8+1) till a 96th (96=V/2−V/8) view is set to be a value represented by a straight line linking the number of times of addition Xn of the 32nd (32−V/8) view with the 97th (97=V/2−V/8+1) view.

At step F5, as shown in FIG. 9, the number of times of addition Xn' from a 161st (161=V/2+V/8+1) view till a 224th (224=V−V/8) view is set to be a value represented by a straight line linking the number of times of addition Xn'of a 160th (160=V/2+V/8) view with the number of times of addition Xn of a 225th (225=V−V/8+1) view.

Figure 10:
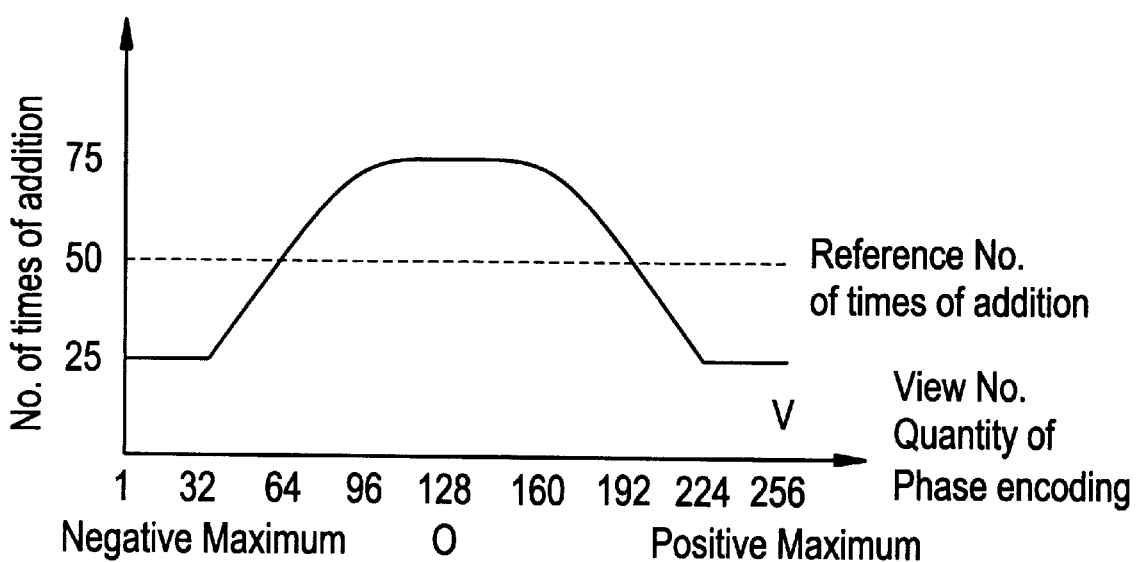
FIG. 10 is an explanatory diagram illustrating the result of calculation of the number of times of addition in the second mode of implementing the invention.

At step F6, as shown in FIG. 10, the balance "50" of the subtraction of "25"(−N−N/2) from the number of times of addition Xn'=75 from the 33rd(33=V/8+1) view till the 224th (224=V−V/8) view is multiplied by the following Hamming function:

$$Wn=0.54-0.46\cdot\cos\{2\pi(n-V/8)/(3V/4)\}$$

Or it is multiplied by the following Hanning function:

$$Wn=0.5(1-\cos\{2\pi(n-V/8)/(3V/4)\}$$

Then, "25"(=N−N/2) is added. Further, the resultant sum is subjected to discrete processing, whose result represents the number of times of addition Xn in the nth view. Thus, where an integral function is denoted by int{ }, the number of times of addition Xn of the nth view is calculated by:

$$Xn=int\{[Xn'-(N-N/2)]\cdot Wn+(N-N/2)\}$$

In the second mode of implementation described above, too, picture quality can be efficiently improved without increasing the overall number of times of data collection (which is less than in the first mode of implementation). Furthermore, artifacts resulting from differences in noise structure between parts differing in the number of times of addition Xn can be restrained.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging method comprising the steps of:

configuring k spaces out of views ranging from a first view through a Vth view which differ in quantity of phase encoding;

collecting data by a number of times of addition N in an nth view, wherein nth is between first view and Vth view;

arithmetically averaging data of said nth view of said collected data thereby resulting in average data An; and using said average data An for image reconstruction, wherein the number of times of addition N are determined as follows:

(Step E1) set number at times of addition to be (N−N/2) from a first view till $(V/8)^{-th}$ view;

(Step E2) set number of times to be (N−N/2) from $(V+V/8+1)^{-th}$ view till Vth view;

(Step E3) set number of times of addition to be (N+N/2) from $(V/8+1)^{-th}$ view till $(V-V/8)^{-th}$ view; and (step E4) set number of times of addition from $(V/8+1)^{-th}$ view till $(V-V/8)^{-th}$ to number of times resulting from discrete processing of addition of (N−N/2) to product of multiplication of balance of subtraction of (N−N/2) from earlier calculated number of times of addition by either a Hamming function or a Hanning function.

2. The method of claim 1, wherein at step E1, the number of times of addition from a first view till a 32nd view is set to be 25; and at step E2, the number of times of addition from a 225th view till a 256th view is set to be 25; at step E3, the number of times at addition from a 33rd view till at 224th view is set to be 75; and at step E4, the balance '50' of the subtraction of '25' from the number of times of addition 75 from the 33rd view till the 224th view is multiplied by the following Hamming function:

$$Wn=0.54-0.46\cdot\cos[2\pi(n-V8)/(3V/4)]$$

or is multiplied by the following Manning function:

$$Wn=0.5(1-\cos[2\pi(n-V/8)/(3V/4)]$$

then, '25' is added.

3. A magnetic resonance imaging method comprising the steps of:
configuring k spaces out of views ranging from a first view through a Vth view which differ in quantity of phase encoding;
collecting data from a number of times of addition N in an nth view, wherein nth is between first view and Vth view,
arithmetically averaging data of said nth view of said collected data thereby resulting in average data An; and
using said average data An for image reconstruction; therein
the number of times of addition are determined as follows:
(Step F1) set number of times of addition to be $(N-N/2)$ from first view till $(V/8)^{-th}$ view;
(Step F2) set number of times of addition to be $(N-N/2)$ from $(V-V/8+1)^{-th}$ view till Vth view;
(Step F3) set number of times of addition to be $(N+N/2)$ from $(V/2-V/8+1)^{-th}$ view til $(V/2+V/8)^{-th}$ view;
(Step F4) set number of times of addition from $(V/8+1)^{-th}$ view till $(V/2-V/8)^{-th}$ view to be a value represented by a straight line linking number or times of addition of $(V/8)^{-th}$ view with $(V/2-V/8)^{-th}$ view;
(Step F5) set number of times or addition from $(V/2+V/8+1)^{-th}$ view till $(V-V/8)^{-th}$ view to be a value represented by a straight line tinting number of times at addition of $(V/2+V/8)^{-th}$ view with $(V-V/8+1)^{-th}$ view; and
(Step F6) set number of times addition from $(V/8+1)^{-th}$ view till $(V-V/8)^{-th}$ view to number of times resulting from discrete processing at addition of $(N-N/2)$ to product of multiplication of balance of subtraction of $(N-N/2)$ from an earlier calculated number of times of addition by either a Hamming function or a Hanning function.

4. The method of claim 3, wherein at step F1, the number of times of addition from the first view till a 32nd view is set to be 25; at Step F2, the number of times of addition from a 225th view till a 256th view in set to be 25; at step F3 the number of times of addition from a 97th view till a 160th view is set to be 75; at step F4, the number of times of addition from a 33rd view till a 96th view is set to be a value represented by a straight line linking the number of times at addition of the 32nd view with the 97th view; at step F5 the number of times of addition from a 161st view till a 224th view meet to a value represented by a straight line linking the number of times of addition of a 160th view with the number of times of addition of a 225th view; and at step F6, the balance '50' of the subtraction of '25' from the number of times of addition 75 from the 33rd view till the 224th view is multiplied by the following Hamming function:

$$Wn=0.54-0.46\cdot\cos[2\pi(n-V/8)/(3V/4)]$$

or is multiplied by the following Hanning function:

$$Wn=0.5(1-\cos[2\pi(n-V/8)/(3V/4)]$$

then, '25' is added.

5. A magnetic resonance imaging apparatus comprising:
an RF pulse transmitting means;
a slope pulse applying means;
a nuclear magnetic resonance signal receiving means; and
control means for controlling the foregoing components, said control means comprising:
means for configuring k spaces out of views ranging from a first view through a Vth view which differ in quantity of phase encoding;
means for collecting data by a number of times of addition N is an with view, wherein nth is between first view and Vth view;
means for arithmetically averaging data of said nth view of said collected data thereby resulting in an average data An; and
means for using said average data An for image reconstruction; wherein
the number of times of addition N are determined as follows:
(Step E1) set number of times of addition to be $(N-N/2)$ from a first view till $(V/8)^{-th}$ view;
(Step E2) set number of times to be $(N-N/2)$ from $(V-V/8+1)^{-th}$ view till $V^{-th}$ view;
(Step E3) set number of times of addition to be $(N+N/2)$ from $(V/8+1)^{-th}$ view till $(V-V/8)^{-th}$ view;
(Step E4) set number of times of addition from view till $(V-V/8)^{-th}$ view to number of times resulting from discrete processing of addition of $(N-N/2)$ to product of multiplication of balance of subtraction of $(N-N/2)$ from earliest calculated number of times of addition by either a Hamming function or a Hanning function.

6. The apparatus of claim 5, wherein at step E1, the number of times of addition from a first view till a 32nd view is set to be 25, at step E2, the number of times of addition from a 225th view till a 255th view is set to be 25; at step E3 the number of times of addition from a 33rd view till a 224th view is set to be 75; and at step E4, the balance '50' of the subtraction of '25' from the number at tins of addition 75 from the 33rd view till the 224th view is multiplied by the following Hamming function: $Wn=0.54-0.45\cdot\cos[2\pi(n-V8)/(3V/4)]$ by the following Hanning function:

$$Wn=0.5(1-\cos[2\pi(n-V/8)/(3V/4)]$$

then '25' is added.

7. A magnetic resonance imaging apparatus comprising:
an RF pulse transmitting means;
a slope pulse applying means;
a nuclear magnetic resonance signal receiving means; and
control means for controlling the foregoing components, said control means comprising:
means for configuring k spaces out of views ranging from a first view through a Vth view, which differ in quantity of phase encoding;

means for collecting data by a number of times of addition N in an nth view, wherein nth is between first view and Vth view;

means for arithmetically averaging data of maid nth view of said collected data thereby resulting in average data An; and means for using said average data An for image reconstruction; wherein the number of times of addition N are determined as follows:

(Step F1) set number of times of addition to be $(N-N/2)$ from a first view till $(V/8)^{-th}$ view;

(Step F2) set number of times of addition to be $(N-N/2)$ from $(V-V/8)^{-th}$ view till Vth view;

(Step F3) set number of times of addition to be $(N-N/2)$ from $(V/2-V/8+1)^{-th}$ view till $(V8+1)^{-th}$ view;

(Step F4) set number of times of addition from view till $(V/2-V/8+1)^{-th}$ view to be a value represented by a straight line linking number of times of addition of $(V/8)^{-th}$ view with $(V/2-V/8+1)^{-th}$ view;

(Step F5) set number of times of addition from $(V2-V/8+1)^{-th}$ view till $(V-V/8)^{-th}$ view to be a value represented by a straight line linking number of times of addition of $(V/2+V/8)^{-th}$ view with $(V-V/8+1)^{-th}$ view; and (Step F6) set number at times of addition from $(V/8+1)^{-th}$ view till $(V-V/8)^{-th}$ view to number of times resulting from discrete processing of addition of $(N-N/2)$ to product of multiplication of balance of subtraction of $(N-N/2)$ from an earlier calculated number of times of addition by either Hamming function or Manning function.

8. The apparatus of claim 7, wherein at step F1 the number of times of addition from the first view till a 32nd view is set to be 25; at step F2, the number et times of addition from a 225th view till 56th view is set to be 25; at step F3, the number of times of addition from a 97th view till a 160th view is set to be 75, at step F4, the number of times of addition from a 33rd view till a 96th view is set to be a value represented by a straight line linking the number of times of addition of the 32nd view with the 97th view; at step F5, the number or times of addition from a 161st view till a 224th view is set to a value represented by a straight line linking the number of times of addition of a 160th view with the number of times of addition of a 225th view; and at step F6, the balance '50' of the subtraction at '25' from the number of times of addition 75 from the 33rd view till the 224th view is multiplied by the following Hamming function: $Wn=0.54-0.46 \cdot \cos[2\pi(n-V/8)/(3V/4)]$, or is multiplied by the following Hamming function: $Wn=0.5(1-\cos[2\pi(n-V/8)/(3V/4)]$, then '25' is added.

* * * * *